United States Patent [19]

Weitzel

[11] 4,052,251

[45] Oct. 4, 1977

[54] METHOD OF ETCHING SAPPHIRE UTILIZING SULFUR HEXAFLUORIDE

[75] Inventor: Charles Edward Weitzel, Dayton, N.J.

[73] Assignee: RCA Corporation, New York, N.Y.

[21] Appl. No.: 736,882

[22] Filed: Oct. 29, 1976

[30] Foreign Application Priority Data

Mar. 2, 1976 United Kingdom ............ 08317/76

[51] Int. Cl.² .......................................... H01L 21/38
[52] U.S. Cl. .................................... 156/612; 156/613; 156/643; 156/646; 156/655; 156/661; 156/667
[58] Field of Search ................ 148/175; 156/611, 612, 156/613, 646, 655, 657, 662, 600, 643, 661, 667; 427/86, 309

[56] References Cited

U.S. PATENT DOCUMENTS

| 3,433,686 | 3/1969 | Marinace | 148/175 |
|---|---|---|---|
| 3,546,036 | 12/1970 | Manaseuit | 156/646 |
| 3,574,014 | 4/1971 | Hugle | 156/657 |
| 3,629,016 | 12/1971 | Glendinning et al. | 156/646 |
| 3,652,324 | 3/1972 | Chu et al. | 156/646 |
| 3,679,502 | 7/1972 | Hads | 156/646 |
| 3,717,514 | 2/1973 | Burgess | 148/175 |
| 3,743,552 | 7/1973 | Fa | 148/175 |
| 4,008,111 | 2/1977 | Rutz | 156/667 |

OTHER PUBLICATIONS

Stinson et al., "Sulfur Hexafluoride Etching Effects on Silicon", *J. Electrochemical Society,* vol. 123, No. 4, Apr. 1976, pp. 551-555.

Anderson et al., "Etching of SiO Using Plasma", *IBM Technical Disclosure Bulletin,* vol. 16, No. 6, Nov. 1973, p. 1892.

*Primary Examiner*—Charles E. Van Horn
*Assistant Examiner*—Jerome W. Massie
*Attorney, Agent, or Firm*—H. Christoffersen; R. P. Williams; W. L. Muckelroy

[57] ABSTRACT

A process for forming a blind hole having an isosceles trapezoidal cross-section in a sapphire substrate using a sulfur hexafluoride gas etchant and an etch mask of silicon nitride on top of silicon dioxide. A composite of sapphire, silicon dioxide and silicon nitride wherein silicon dioxide is located in between the sapphire and the silicon nitride; and the silicon nitride and silicon dioxide are congruently apertured.

13 Claims, 4 Drawing Figures

METHOD OF ETCHING SAPPHIRE UTILIZING SULFUR HEXAFLUORIDE

This invention was made in the course of a contract with the Department of the Air Force.

This invention relates to vapor phase etching of sapphire and more particularly to the selective etching of a sapphire substrate with a gaseous mixture containing sulfur hexafluoride.

A major problem in the processing of silicon-on-sapphire semiconductor devices has been the electrical instabilities introduced into the electrical characteristics of silicon-on-sapphire devices by junctions formed on the edges of the mesas formed on the sapphire substrates. One way of eliminating problems associated with the edge regions of these silicon mesas is to bury the mesas or imbed them in the sapphire substrate. A method for doing this has been to mill holes, as by means of an ion beam, of appropriate size adapted to receive the epitaxial growth of silicon therein. This method has proved extremely expensive and therefore is not well suited for mass production of silicon-on-sapphire devices. Thus, an effective and efficient, as well as economical, means for manufacturing apertures in sapphire which are adapted for growth of epitaxial silicon therein is needed.

It is known that sulfur hexafluoride may be used to etch sapphire. Other than ion beam milling and etching sapphire with sulfur hexafluoride or fluorinated hydrocarbons, few if any other means are available for selectively placing blind holes or apertures in the extremely hard sapphire substrate. Sapphire is a very difficult material to work with in terms of shaping it into a desired form because it is generally impervious to most acids and other reacting materials used and known in the semiconductor processing art.

It is known that both sulfur tetrafluoride and sulfur hexafluoride etch sapphire at elevated temperatures above 1050° C and produce smooth, mirror finish surfaces. In fact, it has been disclosed that sulfur hexafluoride etches sapphire considerably when helium is the carrier gas and almost not at all when hydrogen is used as a carrier gas, at temperatures of approximately 1350° C. As known, hydrogen gas, when used to treat sapphire at a temperature below 1500° C, limits sulfur hexafluoride to a very low etch rate. See Manasevit et al., "Gas Phase Etching of Sapphire with Sulfur Fluorides", *Journal of the Electrochemical Society, Solid State Science*, NO. 2, Vol. 114, February, 1967.

As known, a silicon surface may be etched or polished with a gaseous mixture of sulfur hexafluoride of high purity and a carrier gas such as hydrogen at temperatures between 950° and 1250° C. Sulfur hexafluoride must have a low nitrogen concentration with a preferred nitrogen concentration being less than 200 ppm. by weight. See U.S. Pat. No. 3,679,502, issued July 25, 1972, to R. G. Hays.

IN THE DRAWING

FIG. 3b is a plan view of FIG. 3a.

Figure 1:
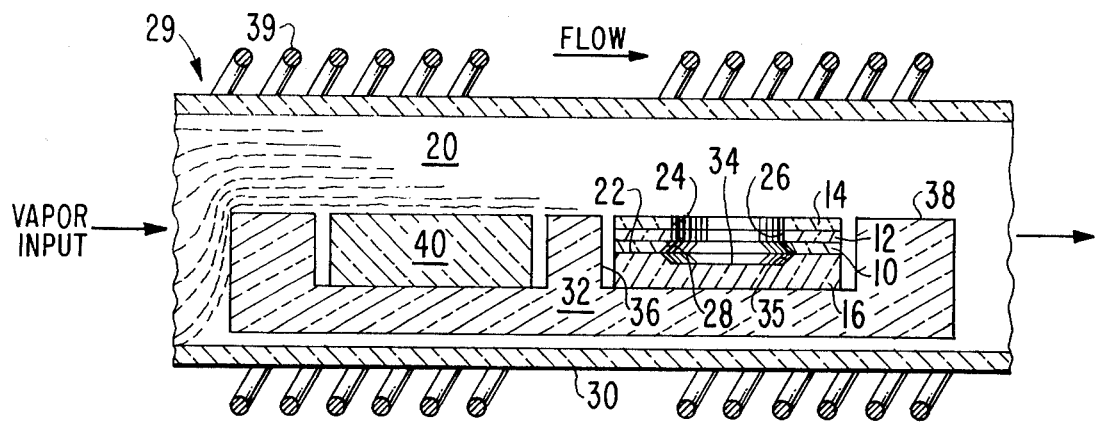
FIG. 1 is a cross section graphically depicting the present method and composite.

In accordance with this invention, it has been determined that a tri-layer mask comprising a first layer 10 (FIG. 1) of silicon dioxide, a silicon nitride layer 12 and a second layer 14 of silicon dioxide may be used as an effective mask against etching of a sapphire substrate 16 with sulfur hexafluoride vapor 20, for example.

Typically, the first layer 10 of silicon dioxide adjacent the substrate 16 is no thinner than 80 Angstroms; the middle silicon nitride layer 12 is at least 500 Angstroms thick; and the exposed outer layer 14 of silicon dioxide is at least greater than 80 Angstroms thick.

The novel mask may be placed adjacent the substrate 16 whereby the mask protects the covered portions of the surface of the substrate 16 against etching by sulfur hexafluoride vapor 20 and whereby the sapphire is satisfactorily etched with the sulfur hexafluoride vapor 20 at a preferred temperature at approximately 1000° C but no greater than 1050° C wherein the normal percentage of the gaseous etch mixture for the sulfur hexafluoride is no greater than 4%, and the balance hydrogen. Physico-chemically equivalent substrates other than sapphire are contemplated as being within the scope of this novel invention.

In accordance with this novel invention, the etch mask is used in combination with an etchant comprised of sulfur hexafluoride vapor 20 as part of a novel etching method for the production of blind holes in a sapphire substrate as described below.

Typically, sapphire substrates 16 with surfaces approximately parallel to the [$\bar{1}102$] plane are cleaned by known decontamination steps. The substrates are first scrubbed with a commercial soap solution to remove foreign particles and further cleansed in first and second standard cleaning solutions.

The first standard cleaning solution consists of 50% water, 25% hydrogen peroxide, and 25% ammonium hydroxide, by volume. The second standard cleaning solution consists of 50% water, 25% hydrogen peroxide, and 25% hydrochloric acid, by volume.

The substrates are first boiled in the first standard cleaning solution for approximately 10 minutes and then boiled in the second standard cleaning solution for approximately 10 minutes. The first standard cleaning solution may be considered a means for removing grease and the second standard cleaning solution may be considered a means for removing metal contaminants from the wafer. The substrates are subsequently dried by any known means in the art.

To further insure the cleanliness of the substrate 16 prior to subsequent processing steps, and to insure the absence of any other chemical reaction which may upset the protection afforded by the novel mask to be applied to the substrate or wafer, the wafers are sintered in palladium-diffused ultra pure hydrogen gas at 1200° C for approximately 30 minutes.

Next, the above steps outlined for use of the first and second standard cleaning solutions are repeated, prior to deposition of the first layer 10 of silicon dioxide. The first layer 10 of silicon dioxide is deposited adjacent an exposed surface 22 of the substrate 16 from a reaction of silane ($SiH_4$) with oxygen. Electronic grade gases are used for the deposition which occurs at 300° C. Rate charts are commonly available and known in the art wherein the amount of silicon dioxide deposited per unit time is provided for a given temperature. Typically, 80 Angstroms of silicon dioxide are deposited at 300° C when the process is carried out for approximately 1 minute.

Next, a middle silicon nitride layer 12 is deposited onto the first layer 10 of silicon dioxide previously deposited. Silicon nitride is produced from the reaction of silane ($SiH_4$) with nitrogen and ammonia ($NH_3$). The nitride deposition is performed, for example, in a "pancake style"]reactor. Typically, 3.5 minutes is required to deposit 500 Angstroms of $Si_3N_4$ at 800° C.

The second layer 14 of silicon dioxide ($SiO_2$) is deposited adjacent to the silicon nitride ($Si_3N_4$) layer 12 from a reaction of silane with oxygen. It is essential that this oxide layer 14 be no thinner than 2,000 Angstroms. The inventor at first used this second layer 14 of silicon dioxide as an etch mask for defining the silicon nitride layer 12 underneath. However, it was later discovered that this layer is essential in reducing the leakage current associated with the edge of planar N-channel silicon devices produced in the sapphire substrate 16. If the second layer 14 of silicon dioxide is less than 2,000 Angstroms, there is a marked increase in the leakage current of such N-channel devices. Accordingly, an essential aspect of the invention is the use of this tri-layer mask on the substrate.

Next, photoresist is applied to the top or exposed layer of silicon dioxide of the mask and the photoresist is selectively exposed and the photoresist developed into a pattern which acts as an etch mask for the layer 14 of silicon dioxide. The layer 14 of silicon dioxide is selectively etched as defined by the photoresist pattern in a solution of buffered hydrochloric acid. The photoresist is then removed in a solution of Caro's acid, a solution of hydrogen peroxide and sulfuric acid ($H_2SO_4$).

The middle layer 12 of the tri-layer mask, comprised of silicon nitride ($Si_3N_4$), is etched using the now apertured layer 14 of silicon dioxide as an etch mask. Etching the top layer 14 of silicon dioxide with hydrochloric acid produces an aperture 24 in the layer having substantially vertical sidewalls. Preferably, in the manufacture of planar silicon-on-sapphire devices wherein the silicon is imbedded in the sapphire substrate and the top surface of the silicon is flush with the surface of the sapphire substrate, the aperture formed in the layer of silicon dioxide is typically rectangular in plan view. The silicon nitride layer 12, masked by the top layer 14 of silicon dioxide, is then subjected to a means for forming an aperture therein such as concentrated phosphoric acid at a temperature of 180° C, for example. An aperture 26 is formed in the layer of silicon nitride which is congruent with the aperture 24 previously formed in the layer 14 of silicon dioxide.

Next, the first layer 10 of silicon dioxide between the sapphire substrate 16 and the silicon nitride layer 12 is subjected to a means for forming an aperture 28 therein, congruent with the apertures 24 and 26 previously formed in the silicon nitride layer 12 and silicon dioxide layer 14. This means may be a solution of buffered hydrochloric acid at a temperature of 23° C, for example. It is critical to the present process that the first layer 10 of silicon dioxide be thinner than the top layer 14 of silicon dioxide. One known and manifest reason for this criticality is that the presence of a portion of the layer 14 is necessary if good, low leakage current, N-channel silicon-on-sapphire devices are to be formed in the sapphire substrate 16.

First and second standard cleaning solutions are reapplied and the processing steps associated therewith are again performed.

Another step typically used in the processing of the sapphire substrate 16 provides what is considered as densification of the silicon dioxide and silicon nitride comprising the tri-layer mask. This step has, however, not been determined to be essential to the effective use of the tri-layer mask in the application of sulfur hexafluoride to exposed sapphire. Densification is a process wherein the two layers of silicon dioxide and the layer of silicon nitride thereinbetween are subjected to a temperature of 1050° C, for example, in a helium ambient for a period of 15 minutes. The purpose of this densification process is presumably to increase the etch resistance of the tri-layer mask.

The theory underlying the densification process is that deposited silicon dioxide and silicon nitride are not pure, or for that matter, totally crystallized compounds. Heating these materials to a high temperature tends to make them more like chemically-pure compounds. This step increases the dimensional control of the apertures 24, 26 in the tri-layer mask. Without the step there is the possibility that the apertures 24 and 26 in the tri-layer mask may be uncontrollably dilated upon application of hydrofluoric acid.

The removal step wherein the first layer 10 of silicon dioxide is congruently apertured by application of the hydrofluoric acid etchant to the silicon dioxide exposes the sapphire substrate 16 and actually widens the aperture 28 formed in the silicone dioxide at the interface with the substrate 16 such that the aperture is believed to have a cross section resembling an isosceles trapezoid. Hence, the opening in the first layer 10 of silicon dioxide at the interface with the silicon nitride is believed smaller than the opening in the first layer 10 of silicon dioxide at the interface with the sapphire substrate 16. The aperture is therefore still dilated somewhat by the application of the hydrofluoric etchant, although densified. The first layer 10 is also further dilated by the application of the vapor 20 in spite of the densification thereof. This is perhaps due to impurities remaining in the silicon dioxide after densification which are attacked by the hydrofluoric acid and the sulfur hexafluoride vapor 20 whereas a tri-layer mask comprising non-densified silicon dioxide and non-densified silicon nitride is found to greatly react with hydrofluoric acid and to provide a less effective mask such that when a non-densified tri-layer mask is adjacent the substrate 16, the aperture 28 with controlled dimensions cannot be formed in the layer 10 adjacent the substrate 16 with hydrofluoric acid. It is believed that densification of silicon dioxide and silicon nitride increases their chemical resistance to sulfur hexafluoride.

The sapphire substrate 16 having the tri-layer mask of silicon dioxide-silicon nitride-silicon dioxide appositioned thereto is then etched in a gaseous vapor 20 of hydrogen and sulfur hexafluoride. The gas phase etching step, as it is technically referred to, is done in a rectilinear hot wall air-cooled reactor 29 comprising a quartz tube 30 having a cross section of 5 × 10 cm., for example. The substrate is actually placed on a silicon carbide coated graphite susceptor 32 having dimensions of 7.5 × 30 × 1.25 cm., for example. It is essential for uniform etching to be formed (on the floor 34 of the blind hole 35) in the sapphire substrate 16, that the substrate 16 be placed in a recess 36 in the susceptor 32 such that the layer 14 on the substrate 16 is flush with a surface 38 of the susceptor 32. The diameter of the recess 36 is only slightly larger than the substrate diameter and the recess may be approximately 12 mils deep, for example, the approximate thickness of a 1½ inch diameter sapphire substrate.

Another feature of the present process, which aids in assuring that the floor of the blind aperture formed in the sapphire is uniform and smooth, is to place a dummy substrate 40 in the susceptor 32 upstream of the wafer to be etched.

The carrier gas for the gas phase etching mixture comprises palladium-diffused hydrogen. Typically, the gas etchant vapor 20 or mixture comprises 2% sulfur hexafluoride having a purity of 99.995% and hydrogen having a purity of at least 99.999%. It is possible to etch the sapphire substrate 16 and form the blind holes 35 required therein at temperatures between 900° and 1100° C. Etching at temperatures above 1050° C forms a blind hole in the sapphire which has a rough or pitted surface.

Figure 2:
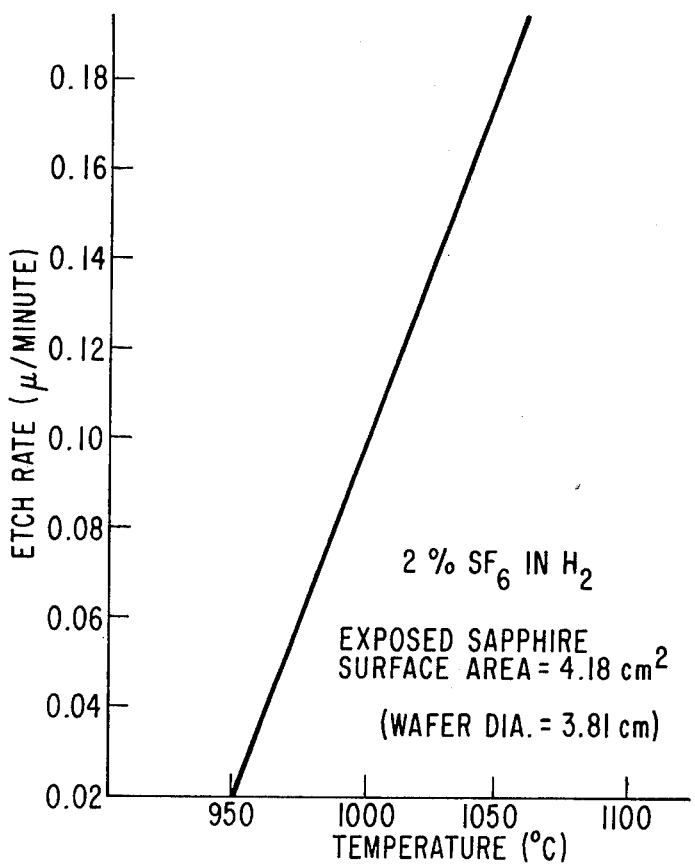
FIG. 2 is a graph showing etch rate versus etch temperature for 2% $SF_6$ in $H_2$.

The etching rate for the sulfur hexafluoride may be determined from FIG. 2 wherein there is shown a plot of the average etch rate over a 10-minute period, versus temperature, for sulfur hexafluoride comprised of an etch mixture comprising 2% sulfur hexafluoride in hydrogen.

The temperature at which the process occurs may be determined directly with an optical pyrometer (not shown) focused on the susceptor 32 made of graphite, for example. The inventor has discovered that the highest temperature using the vapor 20 at which roughening or pitting of the floor 34 does not occur is between 1000° and 1050° C. The percentage range by volume for the sulfur hexafluoride gas in the vapor, determined experimentally, is from ½ to 4% sulfur hexafluoride. Typically, the process is best performed at 1000° C on an exposed sapphire surface area of 4.18 cm$^2$, using a gas phase etchant comprising 2% of sulfur hexafluoride is hydrogen and this etch mixture provides a blind hole 35 in the sapphire substrate 16 having a depth of 0.8 micrometers in a time period of approximately 10 minutes. However, it is suggested by the inventor that in a different operational set up this projected ideal mixture and temperature-time profile may be different.

Upon placing of a sapphire wafer with an approximately apertured tri-layer mask appositioned thereto into the reactor 29, the gas phase etching cycle is begun by flushing out the air in the reactor, using nitrogen. The nitrogen is then removed or flushed out with palladium-diffused hydrogen. The susceptor 32 is then heated, using ratio frequency coils 39, to the desired etching temperature. The vapor 20 is allowed to flow over the sapphire substrate 16 for a desired etching period and then the supply of sulfur hexafluoride gas is turned off and the wafer allowed to cool back to a lower temperature. The palladium-diffused hydrogen gas is then flushed out by displacement with nitrogen gas. Once this is accomplished, the substrate 16 may then be removed from the reactor 29.

The graphite susceptor 32 is reuseable and may actually be used for a great quantity of gas phase etching process cycles. However, the inventor has discovered that it is important when a new susceptor is used to outgas the susceptor by heating prior to incorporating into the gas phase etching process. Outgasing the graphite susceptor 32 serves also to prevent a rough or pitted floor 34 for the blind hole 35 formed in the sapphire by the novel sulfur hexafluoride etching process.

Formation of the congruent blind hole 35 in the sapphire substrate 16 removes a portion of the second layer 14 of silicon dioxide exposed to the gas etchant. Notwithstanding, the tri-layer mask remains and may be removed by an etch solution comprising 50% nitric and 50% hydrofluoric acid.

Next, the first and second standard cleaning solutions are reapplied in a manner as heretofore described. The sapphire substrate 16 is afterwards sintered in a hydrogen atmosphere.

Figure 3A:
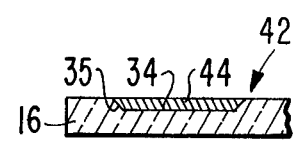
FIG. 3a is a cross-sectional view of an apertured substrate filled with silicon.
Figure 3B:
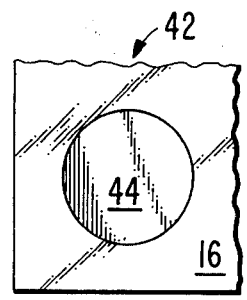

As shown in FIGS. 3a and 3b, the completed sapphire substrate 16, properly cleaned, may be used to form a composite 42 of imbedded silicon 44 epitaxially formed on the sapphire substrate 16. For example, the composite 42 is made by epitaxially growing the silicon 44 from a reaction of silane with hydrogen. The silicon 44 is grown in the blind hole 35 formed in the substrate 16 by epitaxial growth onto the exposed floor 34 of the blind hole 35. A means for reducing the deposited silicon 44 such that silicon remains only within the blind hole 35 of the sapphire substrate 16 as shown in FIG. 3b is lapping or grinding of the silicon away from the surface thereof until the substrate 16 is reached. Subsequently, the substrate 16 may be polished to provide a smooth, mirror-like surface upon which diffusions may be accomplished to form a silicon-on-sapphire planar device using the silicon 44 deposited in the blind hole 35.

I claim:

1. A process for forming blind holes in a sapphire or physico-chemically equivalent substrate comprising:
    a. depositing a layer of silicon dioxide having a first thickness adjacent a surface of the sapphire substrate;
    b. depositing a layer of silicon nitride, having a second thickness, adjacent the silicon dioxide;
    c. defining a preselected pattern having an aperture in a mask comprised of the silicon nitride and the silicon dioxide; and
    d. exposing the mask and portions of the sapphire substrate unprotected by the mask to a gas mixture comprised of sulfur hexafluoride gas and a carrier gas at a temperature less than 1,050° C for a time period sufficient to form said blind holes.

2. The process of claim 1, wherein the carrier gas is hydrogen.

3. The process of claim 2, wherein sulfur hexafluoride comprises from ½ to 4% of the volume of the gas mixture.

4. The process of claim 3, wherein the first thickness is approximately 80 to 1000 Angstroms and the second thickness is approximately 100 to 3000 Angstroms.

5. The process of claim 4, wherein the gas mixture has a flow rate over the substrate of 10 to 50 liters per minute.

6. The process of claim 5, wherein the substrate is exposed to the gas mixture for a time period between 3 and 10 minutes.

7. The process of claim 6, wherein the substrate with the mask thereon is heated to less than 1,050° C with a radio frequency coil located around a reactor housing the substrate.

8. A process for epitaxially depositing single crystal silicon on sapphire comprising the steps recited in claim 1 and the further step of depositing epitaxially formed single crystal silicon in said blind hole.

9. A process for forming blind holes in a sapphire substrate comprising:
    a. depositing a first layer of silicon dioxide having a first thickness adjacent a surface of the sapphire substrate;
    b. depositing a layer of silicon nitride having a second thickness, adjacent the first layer of silicon dioxide;

c. depositing a second layer of silicon dioxide, having a third thickness, adjacent the layer of silicon nitride;

d. defining a preselected pattern having at least one aperture in a mask comprised of the first layer of silicon dioxide, the layer of silicon nitride, and the second layer of silicon dioxide; and e. exposing the mask and portions of the sapphire substrate unprotected by the mask to a vapor comprised of sulfur hexafluoride and a carrier gas at a temperature no greater than 1,050° C for a time period sufficient to form said blind holes.

10. The process of claim 9, wherein the carrier gas is hydrogen.

11. The process of claim 10, wherein sulfur hexafluoride comprises from 2 to 4% of the volume of the gas mixture.

12. The process of claim 11, wherein the first thickness is 80 to 1000 Angstroms and the second thickness is 500 to 3000 Angstroms.

13. A process for epitaxially depositing single crystal silicon on sapphire comprising the steps recited in claim 10 and the further step of depositing epitaxially formed single crystal silicon in said blind hole.

* * * * *